United States Patent [19]

Krause

[11] Patent Number: 4,854,975

[45] Date of Patent: Aug. 8, 1989

[54] SOLAR CELL WITH INTEGRATED INTERCONNECT DEVICE AND PROCESS FOR FABRICATION THEREOF

[75] Inventor: Stanley J. Krause, Northridge, Calif.

[73] Assignee: Hughes Aircraft Company, Los Angeles, Calif.

[21] Appl. No.: 881,752

[22] Filed: Jul. 3, 1986

[51] Int. Cl.⁴ ............................................. H01L 31/00
[52] U.S. Cl. ..................................... 136/262; 136/292; 136/243; 136/252
[58] Field of Search ................. 136/243, 252, 262, 292

[56] References Cited

U.S. PATENT DOCUMENTS

| | | | |
|---|---|---|---|
| 3,912,540 | 10/1975 | Broder | 136/256 |
| 4,070,206 | 1/1978 | Kressel et al. | 136/255 |
| 4,131,488 | 12/1978 | Lesk et al. | 136/255 |
| 4,295,002 | 10/1981 | Chappell et al. | 136/244 |
| 4,542,258 | 9/1985 | Francis | 136/256 |
| 4,610,077 | 9/1986 | Minahan et al. | 136/256 |
| 4,692,559 | 9/1987 | Ellion et al. | 136/262 |

Primary Examiner—Matthew A. Thexton
Assistant Examiner—Catherine S. Kilby
Attorney, Agent, or Firm—S. M. Mitchell; M. J. Meltzer; A. W. Karambelas

[57] ABSTRACT

A solar cell assembly wherein a solar cell is provided with electrical layer contacts for both the p-type semiconductor layer and the n-type semiconductor layer which are exposed on a top side of the solar cell, so that electrical contact to both layers can be made from the top side of the cell, and a glass cover overlying the solar cell includes a pair of U-shaped electrical cell contacts extending over the sides of the glass cover so that one leg of each U makes contact with one of the layer contacts and the other leg is accessible from the top of the cover glass. External electrical contact to the cell is easily and conveniently made, and cells can be electrically joined to adjacent cells in an array using a connector bar. The glass cover also supports the solar cell so that excess material on the substrate of the solar cell can be etched away to reduce the weight of the solar cell assembly.

9 Claims, 2 Drawing Sheets

SOLAR CELL WITH INTEGRATED INTERCONNECT DEVICE AND PROCESS FOR FABRICATION THEREOF

BACKGROUND OF THE INVENTION

This invention relates to solar cells, and, more particularly, to the fabrication of lightweight solar cells and their interconnection.

Semiconductor solar cells are utilized to convert light energy to useable electrical voltages and currents. Briefly, a typical semiconductor solar cell includes an interface between n-type and p-type transparent semiconductor materials. Light shining on the semiconductor materials adjacent the interface creates hole-electron pairs in addition to those otherwise present, and the minority charge carriers migrate across the interface in opposite directions. There is no compensating flow of majority carriers, so that a net electrical charge results. A useful electrical current is obtained in an external electrical current by forming ohmic contacts to the materials on either side of the interface.

In general terms, a photovoltaic solar cell is fabricated by depositing the appropriate semiconductor layers onto a substrate, and then adding additional components to complete the cell. As an example, a conventional p-on-n gallium arsenide solar cell is fabricated by epitaxially depositing a layer of n-type gallium arsenide onto a single crystal gallium arsenide substrate, and depositing a layer of p-type gallium arsenide overlying the layer of n-type gallium arsenide. The interface between the p-type gallium arsenide and the n-type gallium arsenide forms the basic solar cell active structure. External ohmic electrical contacts to the n-type and p-type layers are applied, and a voltage is measured across the contacts when light energy is directed against the interface. Optionally, a P+ layer of gallium aluminum arsenide may be deposited over the layer of p-type gallium arsenide to limit recombination of charge carriers. To protect the solar cell from physical contact and radiation damage such as encountered in a space environment, it is conventional to apply a transparent cover of glass over the solar cell components.

The solar cells are connected together into large arrays to deliver power of the desired voltage and current. A typical earth satellite such as a Hughes Aircraft Co. HS-376 communications satellite may have as many as 15,000 solar cells, each about 1 inches by 2½ inches in size. Since the cost of raising weight to orbit is high, the weight of the cells, and their associated hardware such as the electrical interconnects between solar cells in the array, should be reduced as much as possible.

The weight of each solar cell is determined in part by the materials chosen. Silicon solar cells are now commonly used. Gallium arsenide is considerably heavier than silicon, but gallium arsenide cells are of interest for spacecraft power applications because of their greater power output per unit surface area of cell. A typical silicon solar cell is about 0.008 inches thick, and silicon solar cells as thin as about 0.002 inches have been prepared. A substantial weight saving is realized if the thickness of the cell is reduced. In principle, the cells can be made quite thin, but in practice very thin cells have been impractical because, once the cell itself is fabricated, it is very difficult to attach external electrical contacts to solar cells. Gallium arsenide and related compounds are rather brittle, and attempts to attach electrical cell contacts to a thin cell often result in cracking of the cell. If a cell less than about 0.001 inch thick can be fabricated, then in most cases the solar cell will be broken during the attempt to attach the cell contacts. It has not been heretofore possible to achieve the objective of fabricating very thin solar cells of brittle materials that can be readily joined into arrays, in the scale of production required to build satellites.

Moreover, the present approach to joining solar cells in large arrays is cumbersome. The present approach to interconnecting solar cells in series, as must be done to achieve the necessary voltages for powering spacecraft systems, uses a "Z-type" connector that extends from the underside of one cell to the top surface of the adjacent cell. The web or main body of the Z-type connector lies between the adjacent solar cells, requiring that the cells be spaced apart to accommodate the connector. The Z-type connector is difficult to install, and its use makes replacement of a failed solar cell quite difficult.

There therefore exists a need for an improved solar cell assembly amenable to attachment of external electrical contacts thereto, including the contacts used to connect the solar cell to an adjacent solar cell. Alternatively stated, since the attachment of the external electrical connectors can be viewed as part of the process of fabrication of the solar cell and of solar cell arrays, there is a need for an improved fabrication process whereby a thin solar cell of brittle materials can be fabricated in a manner allowing the external electrical contacts to be made to the cell. The present invention fulfills this need, and further provides related advantages.

SUMMARY OF THE INVENTION

The present invention resides in a solar cell assembly particularly suitable for attachment of external electrical contacts thereto, where the external electrical contact may be a simple wire connector or a structural connector used to join adjacent cells together into arrays. The solar cell assembly allows fabrication of very thin, yet connectible, solar cells, even of brittle solar cell materials such as gallium arsenide, thereby reducing the weight of the solar cell assembly. The solar cell assembly of the invention is fully compatible with established semiconductor and solar cell fabrication procedures, and does not exclude incorporation of other improvements into the solar cell assembly. The solar cell assembly also permits the use of simpler connectors to adjacent solar cells of an array, thus allowing easier installation of the cells of an array and replacement of failed cells.

In accordance with the invention, a solar cell assembly comprises a solar cell having a layer of a p-type semi-conductor and a layer of an n-type semiconductor, one of the layers overlying the other, and further having two electrical layer contacts, one to each of the semiconductor layers, the layer contacts each having an external contact surface exposed on a top side of the solar cell; and a glass cover overlying the solar cell with a bottom surface of the glass cover in proximity with the top side of the solar cell, the glass cover having a pair of electrical cell contacts extending from the bottom surface of the glass cover to the top surface thereof, the portion of each of the cell contacts at the bottom surface of the glass cover being joined to one of the layer contacts at its external contact surface.

That is, the solar cell assembly includes a p-type layer and an n-type layer, with electrical layer contacts to each layer. The geometry of the layers and electrical layer contacts is arranged so that both layer contacts can be contacted from one side of the solar cell, termed the top side, which is the side facing the sun in normal operation. The glass cover is provided with a pair of electrical cell contacts, one for each of the electrical layer contacts, that register with, and electrically connect to, the respective layer contacts when the glass cover is placed over the solar cell. The electrical cell contacts extend to the top surface of the glass cover, so that electrical connection to both layers can be made by connecting to the respective electrical cell contacts at the top surface of the glass cover. This top-connection feature permits the use of simple flat connector bars to adjacent solar cells of the array, in place of the conventional Z-type connectors.

Preferably, the electrical cell contacts of the glass cover are strips of a conducting metal having a U-shaped configuration that extends over the sides of the cover glass. One leg of the U-shaped strip lies on the bottom surface of the cover glass, to contact one of the electrical layer contacts. The other leg lies on the top surface, to permit external contact, and the bottom of the U passes from the bottom surface to the top surface of the glass cover over the side of the cover glass. Such strips can be applied by deposition of a metallic layer onto the glass in a defined pattern, or by joining prepared strips to the glass.

The solar cell assembly of the invention also allows the fabrication of very thin solar cells of brittle materials. The entire solar cell assembly, including the external electrical contacts, can be first fabricated with a thick, strong substrate layer to support the solar cell assembly during fabrication. After the solar cell assembly is prepared, then all or part of the substrate can be removed by etching, with the integral glass cover acting to support and strengthen the semiconductor layers so that they do not break during etching. Thus, fabricability is enhanced by incorporating the formation of external electrical contacts into the fabrication procedure prior to the step wherein excess substrate is removed from the solar cell.

In accordance with this aspect of the invention, a process for preparing a solar cell assembly comprises the steps of furnishing a solar cell base having a substrate, an etch stop layer overlying the substrate, and a solar cell having a layer of p-type semiconductor and a layer of n-type semiconductor overlying the etch stop layer, the solar cell further having two electrical layer contacts, one to each of the semiconductor layers, the layer contacts each having an external contact surface exposed on a top side of the solar cell; placing a glass cover over the solar cell with a bottom surface of the glass cover in proximity with the top side of the solar cell, the glass cover having a pair of electrical cell contacts each extending from the bottom surface of the glass cover to the top surface thereof, the portion of each of the electrical cell contacts at the bottom surface of the glass cover being disposed adjacent to one of the layer contacts at its external contact surface; joining each of the pair of electrical cell contacts to one of the pair of electrical layer contacts; and etching away at least a portion of the substrate to reduce the total thickness of the solar cell. Typically, the process further includes joining the glass cover to the solar cell, before the etching step, by placing a layer of adhesive between the two before they are contacted together, or by injecting a layer of adhesive between the two after they are contacted together.

As will now be appreciated, the solar cell assembly and fabrication process of the present invention permit the fabrication of thin solar cells of brittle materials. Further, external connections are substantially simpler than with prior solar cells, since electrical contact to both semiconductor layers of the cell can be readily made from the top surface of the glass cover. Other features and advantages of the present invention will become apparent from the following more detailed description, taken in conjunction with the accompanying drawings, which description illustrates, by way of example, a preferred embodiment of the invention.

DETAILED DESCRIPTION OF THE PREFERED EMBODIMENT

Figure 1:
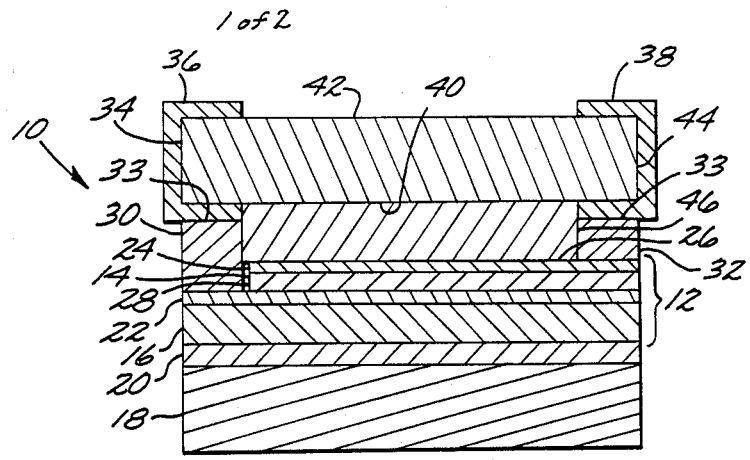
FIG. 1 is a side sectional view of a solar cell assembly of the invention.
Figure 2:
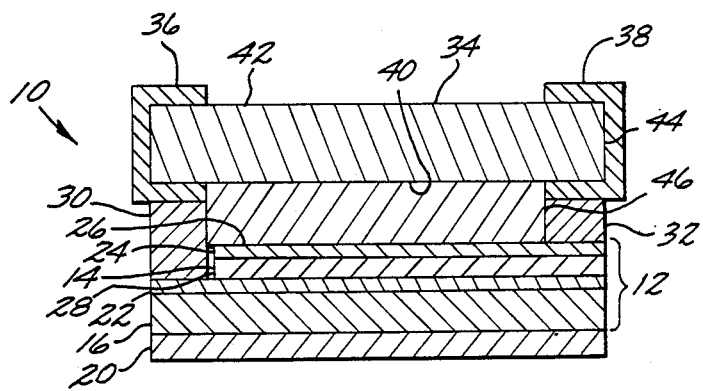
FIG. 2 is a side sectional view of the solar cell assembly of FIG. 1, with the substrate etched away to reduce the thickness of the solar cell.

The present invention is embodied in a solar cell assembly 10, illustrated in FIGS. 1 and 2. The assembly 10 includes a solar cell 12, having two layers of doped semiconductor material. In the illustrated preferred embodiment, the solar cell 12 is a p-on-n gallium arsenide solar cell, having a p-type layer 14 of gallium arsenide doped with a p-type dopant such as beryllium overlying an n-type layer 16 of gallium arsenide doped with an n-type dopant such as tin. The selection of dopants and their concentrations is known to those working in the field of gallium arsenide solar cells, and the present invention may be used in conjunction with all known variations of dopants and doping concentrations. Moreover, the present invention is concerned with the structure of the solar cell assembly and not the specific solar cell materials, and is therefore applicable to silicon solar cells and all other solar cell materials. Its use with gallium arsenide solar cells is of particular interest because of the brittleness of the gallium arsenide when in thin layers and because the density of gallium arsenide provides an incentive for achieving the greatest possible weight reduction of gallium arsenide solar cells.

The solar cell 12 can reside upon and be supported by a substrate 18, upon which it is deposited during fabrication, as illustrated in FIG. 1, or the substrate 18 can be removed to reduce the thickness and weight of the assembly 10, as illustrated in FIG. 2. The substrate is a gallium asrsenide single crystal. To permit removal of the substrate 18, an etch stop layer 20 is disposed between the substrate 18 and the solar cell 12. The etch stop layer 20 is of a material that can be grown epitaxially on gallium arsenide but has sufficiently different chemical characteristics that the substrate 18 can be etched away in a selected etchant, but that the etch stop layer 20 prevents the etchant from attacking the solar cell 12. For gallium arsenide solar cells, the etch stop layer 20 can be $Al_xGa_{1-x}As$ having a value of x of about 0.85 (in atom fraction). The gallium arsenide substrate 18 can be etched away in a mixture of hydrogen peroxide, ammonium hydroxide, and water, but the etch stop layer 20 is not attacked by this etch and prevents etching of the rest of the solar cell 12.

The direct electrical connection to the solar cell 12 is made with face electrodes. Disposed in grooves etched in the n-type layer 16 adjacent the interface between the p-type layer 14 and the n-type layer 16 is an electrode 22 that provides electrical connection to the n-type layer 16. Disposed over the p-type layer 14 is an electrode 24 that provides electrical connection to the p-type layer 14. Preferably, the electrode layers 22 and 24 are of a digitated form, wherein fingers of conducting material extend across the face of the respective layer from a primary conductor. Such a digitated form permits light to reach the interface between the p-type layer 14 and the n-type layer 16, where the photovoltaic effect occurs, without significantly reducing the active area of the interface, and also permits the collection of charge carriers in the electrical circuit. The electrodes 22 and 24 are made of an electrical conductor such as a gold-nickel-zinc alloy or a gold-germanium-zinc alloy.

Electrical connections to the face electrodes 22 and 24 are made through electrode contacts. Connection to the n-layer face electrode 22 is made by an n-layer contact 30 that extends downwardly in a recess 28 from the top side 26 of the solar cell 12. Connection to the p-layer face electrode 24 is made by a p-layer contact 32 deposited on the top thereof. Preferably, the height of the n-layer contact 30 is made greater than that of the p-layer contact 32. The two contacts 30 and 32 should extend about the same distance above the top side 26 of the solar cell 12 to an external contact surface 33. The contacts 30 and 32 are preferably made of a conductor such as silver deposited on top of the electrodes 22 and 24.

The n-layer face electrode 22 and the n-layer contact 30 together form an electrical layer contact for the n-type layer 16 to permit an external contact to the n-type layer 16. Similarly, the p-layer face electrode 24 and the p-layer contact 32 together form an electrical layer contact for the p-type layer 14 to permit an external contact to the p-type layer 14.

A glass cover 34 is attached over the solar cell 12. The glass cover 34 protects the solar cell 12 from handling damage during installation and from particle and radiation damage when in use on the spacecraft. The glass cover 34 also supports, provides strength to, and prevents brittle fracture of the solar cell 12 as depicted in FIG. 2, wherein the substrate 18 is removed. The total thickness of the layers 14 and 16 of the thinned solar cell of FIG. 2 may be as little as 20 micrometers. Since the lateral extent of such a thinned solar cell can be on the order of 1 inch by 2½ inches, a 20 micrometer thickness of the brittle doped gallium arsenide material cannot provide sufficient structural support in the absence of the glass cover 34. The glass cover 34 therefore become a critical structural component if the thin solar cell of FIG. 2 is to be fabricated, and the glass cover 34 must be in place prior to the thinning step. The glass cover 34 cannot be permanently in place prior to thinning, in the conventional approach for providing external electrical contacts, and one aspect of the present invention lies in the approach for providing such external electrical contacts.

The glass cover 34 is preferably formed of a glass that has a coefficient of thermal expansion that is about the same as that of the solar cell 12, to minimize stresses that might be otherwise induced during repeated heating and cooling of the solar cell assembly 10 as it passes from shadow into sunlight and back into shadow during operation. The presently most preferred glass cover 34 is Corning 7940 fused-silica glass in a thickness of about 0.009 to about 0.060 inches, depending upon the planned application. Other types of glasses such as Corning 7070 borosilicate glass may also be acceptable.

The glass cover 34 is provided with a pair of wrap-around U-shaped electrical cell contacts 36 and 38 that each extend from a bottom surface 40 of the glass cover 34 to a top surface 42 of the glass cover 34. One leg of the U of each of the electrical cell contacts 36 and 38 lies on the bottom surface 40, while the other leg of each electrical cell contact 36 and 38 lies on the top surface 42. The trough portion at the bottom of the U of each of the U-shaped contacts 36 and 38 wraps around a side 44 of the glass cover 34, so that the contacts 36 and 38 achieve a wraparound effect of providing an electrically conducting path from the bottom surface 40 to the top surface 42 of the glass cover 34. The portion of the n-layer electrical cell contact 36 lying on the bottom surface 40 is disposed and positioned to contact the n-layer contact 30, and the portion of the p-layer electrical cell contact 38 lying on the bottom surface 40 is disposed and positioned to contact the p-layer contact 32. External electrical contact to the n-type layer 16 is thereby made through a contact from the n-layer electrical cell contact 36 to the n-layer contact 30 to the n-layer face electrode 22, which is in direct contact with the n-type layer 16. Similarly, external electrical contact to the p-type layer 14 is made through a contact from the p-layer electrical cell contact 38 to the p-layer contact 32 to the p-layer face electrode 24, which is in direct contact with the p-type layer 14.

The electrical cell contacts 36 and 38 can be made of any suitable electrical conductor material, with nickel being preferred. The contacts 36 and 38 can be provided in any suitable manner. For the preferred nickel material, the glass cover 34 is masked and the nickel is deposited in the desired pattern by vapor deposition of nickel metal prior to attachment of the glass cover 34. The thickness of the nickel deposited is about 5 micrometers, although this thickness is not critical. The contacts 36 and 38 can be deposited onto the glass cover 34 by other techniques, or can be provided as separate strips. Metallization by vapor deposition or a similar technique is preferred, inasmuch as the contacts 36 and 38 can be made controllably thin in a uniform and reproducible manner.

The electrical cell contacts 36 and 38 are electrically joined to the respective layer contacts 30 and 32 by any appropriate technique. It is preferred to place a small amount of solder, such as 63 weight percent lead, 37 weight percent tin alloy solder, between the respective parts to be joined, to apply downward pressure, and to heat the assembly until the solder melts.

The glass cover 34 is preferably fastened to the top side 26 of the solar cell 12 by an adhesive layer 46 of a material such as FEP polytetraethylene. The primary purpose of the adhesive layer 46 is to exclude contamination such as dust from the face of the solar cell 12 while on the ground, and the adhesive can be omitted if other steps are taken. Other sealing procedures can be used. If the adhesive approach is used, the adhesive material of the adhesive layer 46 can be placed between the top side 26 of the solar cell 12 and the bottom surface 40 of the glass cover 34 during fabrication by silk screening of the adhesive or as a separate layer about 0.002 inches thick. Alternatively, a flowable adhesive such as a liquid silicone adhesive can be injected as a liquid into the cavity between the glass cover 34 and the solar cell 12 defined by the raised contacts 30 and 32 and allowed to cure. A suitable liquid adhesive is Dow Corning type 93-500.

Figure 3:
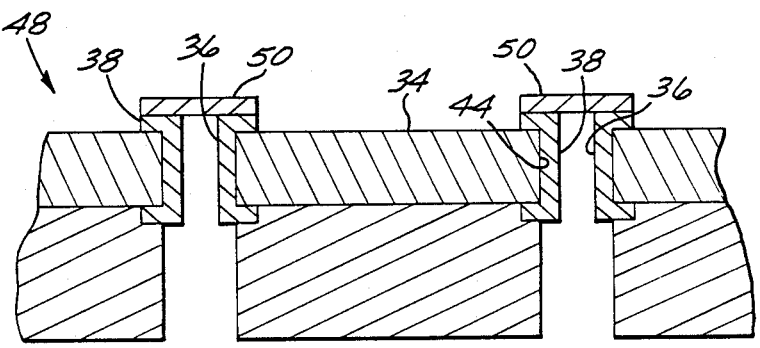
FIG. 3 is a fragmentary side sectional view of an interconnected solar cell array, using solar cell assemblies as illustrated in FIG. 2.

FIG. 3 illustrates the manner of joining solar cell assemblies 10, of the type previously described, to form a solar cell array 48. Since electrical contacts to both the n-type layer 16 and the p-type layer 14 are made at the top surface 42 of the glass cover 34, it is not necessary to use Z-type connectors extending from the bottom of one cell to the top of an adjacent cell. Instead, adjacent solar cell assemblies 10 are arranged so that an n-layer electrical cell contact 36 of one solar cell assembly 10 lies adjacent to a p-type electrical cell contact 38 of the neighboring solar cell assembly 10. Then a connector bar 50 is welded, soldered, brazed or otherwise joined across the cell contacts. Continuation of this procedure results in a continuous series circuit of a number of solar cell assemblies 10.

This approach to electrically joining the solar cell assemblies 10 allows the joining process to proceed more efficiently than possible with Z-type connectors. The connectors bars weigh less, and the solar cells can be spaced closer together, thereby permitting the placement of more solar cells into an available area. The use of the connector bar 50 allows a failed cell to be replaced simply by disconnecting the connector bars to the adjacent cells, lifting the failed solar cell assembly out, setting a new solar cell assembly into place, and reattaching the contact bars.

The present invention also includes a process for preparing a solar cell assembly, as illustrated in FIG. 4 for the preferred embodiment. The solar cell 12 is first furnished, FIG. 4A, the solar cell having the substrate 18, the etch stop layer 20 overlying the substrate 18, the n-type layer 16 overlying the etch stop layer 20, the n-layer face electrode 22 in grooves etched from the top side 26 down to the interface between the layers 14 and 16, the p-type layer 14 overlying the n-type layer 16, and the p-type layer face electrode 24 overlying the p-type layer 14. Each of these layers and elements is prepared by techniques well known in the art. A recess 28 is etched from the top side 26 down to the n-layer face electrode 22. An n-layer contact 30 is formed on the n-layer face electrode 22, and a p-layer contact 32 is formed on the p-layer face electrode 24, with each contact 30 and 32 being raised above the top side 26 of the solar cell 12, FIG. 4B.

Figure 4A:
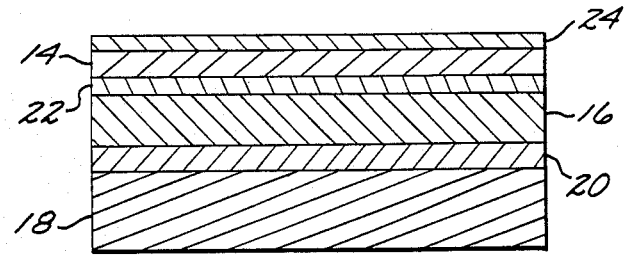
FIGS. 4A–D are a schematic process flow diagram illustrating the cell structure during fabrication of the solar cell assembly of claim 1.
Figure 4B:
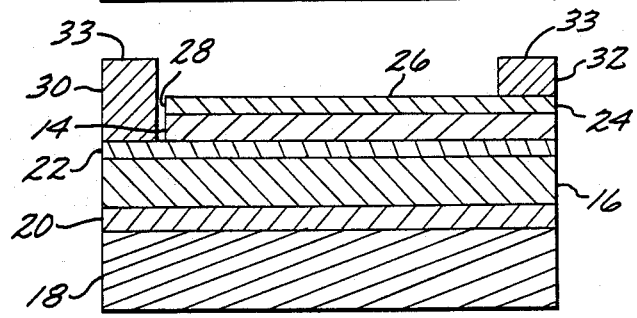
Figure 4C:
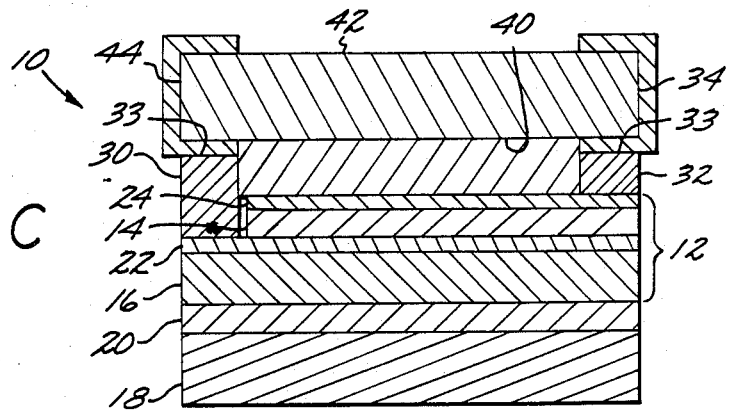

The glass cover 34 is placed over the solar cell 12, so that the glass cover and the solar cell are in registry, see FIG. 4C. The glass cover 34 includes the n-layer U-shaped cell contact 36 and the p-layer U-shaped cell contact 38, as previously described. In the preferred embodiment, a layer of adhesive 46 is applied to the bottom surface 40 of the glass cover 34 in the proper pattern. Solder is applied to the contacts 36 and 38. The glass cover 34 is pressed downwardly onto the top side 26 of the solar cell 12 in a hot press at a temperature of about 300° C., a temperature high enough to melt the solder and cure the adhesive layer 46. Upon cooling, the contacts 36 and 30 are soldered together, as are the contacts 38 and 32, and the solar cell assembly 12 is sealed by the adhesive.

The resulting solar cell assembly 10 is operable, but has the relatively thick substrate 18 required to support the remainder of the solar cell 12 during its fabrication and the attachment of contacts. It is not practical to remove any significant portion of the substrate 18 prior to this stage of the fabrication, since the cell would be likely to crack and fail during fabrication in the absence of a support.

Figure 4D:
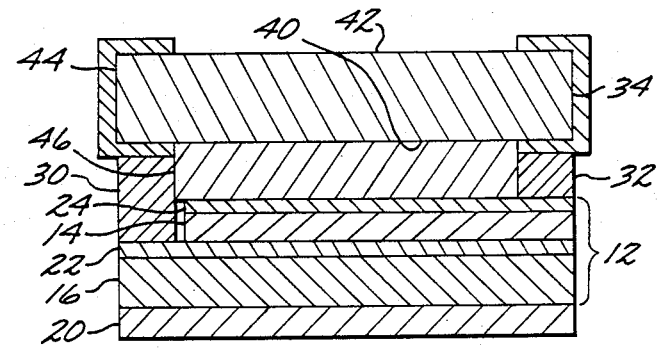

The bonded glass cover 34 supplies the strengthening required to permit thinning of the solar cell assembly, after the cover 34 has been attached. The substrate 18 can then be removed by standard etch techniques to the etch stop layer 20, thereby thinning the solar cell assembly 10 and reducing its weight significantly, as illustrated in FIG. 4D.

The present invention provides an important advance in the art of preparing solar cells. Very thin solar cell assemblies can be prepared, and such assemblies can be readily joined together into arrays. Although a particular embodiment of the invention has been described in detail for purposes of illustration, various modifications may be made without departing from the spirit and scope of the invention. Accordingly, the invention is not to be limited except as by the appended claims.

What is claimed is:

1. A solar cell assembly, comprising:
   a solar cell having a layer of a p-type semiconductor and a layer of an n-type semiconductor, one of said layers overlying the other, and further having two electrical layer contacts, one to each of said semiconductor layers, said layer contacts each having an external contact surface exposed on a top side of said solar cell; and
   a glass cover overlying said solar cell with a bottom surface of said glass cover in proximity with the top side of said solar cell, said glass cover having a pair of electrical cell contacts extending from the bottom surface of said glass cover to the top surface thereof, the portion of each of said cell contacts at the bottom surface of said glass cover being joined to one of said layer contacts at its external contact surface.

2. The solar cell assembly of claim 1, further including a layer of adhesive between said solar cell and said glass cover.

3. The solar cell assembly of claim 2, wherein the adhesive is FEP teflon.

4. The solar cell assembly of claim 1, wherein said solar cell is a gallium arsenide solar cell.

5. The solar cell assembly of claim 1, wherein said layer overlying the other includes an etched recess therethrough, and said layer contact extends into said recess to contact said layer that is overlaid.

6. The solar cell assembly of claim 1, wherein at least one of said cell contacts is a U-shaped strip extending over an end of said glass cover, so that one leg of the U is on the bottom of said glass cover and the other leg of the U is on the top of said glass cover.

7. The solar cell assembly of claim 6, wherein said strip is nickel.

8. The solar cell assembly of claim 1, wherin the thermal expansion coefficients of said glass cover and said solar cell are substantially identical, to minimize thermal expansion strains when said solar cell assembly is heated and cooled.

9. The solar cell assembly of claim 1, wherein said solar cell is less than about 0.001 inch thick.

* * * * *